United States Patent [19]

Schindler

[11] Patent Number: 4,788,511
[45] Date of Patent: Nov. 29, 1988

[54] DISTRIBUTED POWER AMPLIFIER

[75] Inventor: Manfred J. Schindler, Newton, Mass.

[73] Assignee: Raytheon Company, Lexington, Mass.

[21] Appl. No.: 126,542

[22] Filed: Nov. 30, 1987

[51] Int. Cl.⁴ .......................... H03F 3/60; H03F 3/16
[52] U.S. Cl. ..................................... 330/277; 330/54; 330/286
[58] Field of Search .................... 330/53, 54, 277, 286

[56] References Cited

U.S. PATENT DOCUMENTS

| | | | |
|---|---|---|---|
| 3,210,682 | 10/1965 | Sosin | 330/54 |
| 4,311,966 | 1/1982 | Bert et al. | 330/286 |
| 4,337,439 | 6/1982 | Sosin | 330/54 |
| 4,543,535 | 9/1985 | Ayasli | 330/53 |

*Primary Examiner*—Eugene R. LaRoche
*Assistant Examiner*—Steven J. Mottola
*Attorney, Agent, or Firm*—Denis G. Maloney; Richard M. Sharkansky

[57] ABSTRACT

A distributed amplifier includes a plurality of field effect transistors, each having gate, drain, and source electrodes, successively coupled between an input terminal and an output terminal. The gate electrode of each one of successively coupled FETS is coupled to the input terminal through a corresponding one of a plurality of capacitors and selected ones of the drain electrodes of the FETS are coupled to the output terminal through one of a corresponding second plurality of capacitors, with said capacitors being coupled to an output coupling means comprising a plurality of transmission line sections. By providing the second plurality of capacitors to couple the drain electrodes to the output terminal, the output impedance of each one of the field effect transistors is concomitantly increased thereby permitting the periphery of the transistors to be correspondingly increased and thereby providing increased output power and gain from the amplifier circuit.

16 Claims, 7 Drawing Sheets

DISTRIBUTED POWER AMPLIFIER

Government has rights in this invention pursuant to Contract No. DAAL01-86-C-0018 awarded by Department of Army, Fort Monmouth, N.J.

BACKGROUND OF THE INVENTION

This invention relates generally to radio frequency amplifiers and more particularly to radio frequency amplifiers having a plurality of successively coupled field effect transistors arranged to provide a distributed power amplifier.

As is known in the art, radio frequency amplifiers configured as distributed amplifiers having a plurality of successively interconnected field effect transistors have been suggested to provide amplification of radio frequency signals. One problem associated with such type of amplifiers is that in certain applications the output power of the distributed amplifiers is limited over a selected band of operating frequencies.

As described in U.S. Pat. No. 4,543,535 issued to Yalcin Ayasli and assigned to the assignee of the present invention, the output power of the distributed amplifier may be considered as being limited by three constraints. The first constraint is related to the finite input voltage which can be provided to an input gate line without clipping the voltage waveform. The second constraint in output power is that the maximum total gate periphery that can be provided in a single stage limited over a particular range of operating frequencies. The third constraint in output power is related to the mismatch between the actual output impedance of each one of the field effect transistors and an optimum output impedance of such field effect transistors biased for maximum output power.

As described in U.S. Pat. No. 4,543,535, one solution to this problem that overcomes these three constraints is to capacitively coupled the gate electrode of each one of the transistors of the distributed amplifier to the input gate line via capacitors having selected capacitances, and thereby couple selected portions of the input signal to each one of the transistors. This arrangement provides an r.f. voltage divider which reduces the voltage fed to each one of the gate electrodes, thereby increasing the overall input power handling capability of the input circuit of the amplifier. Since the total input power fed to the distributed amplifier can be increased in accordance with the decreased input voltage signal provide each one of the gate electrodes, the arrangement provided a solution to the power presented by the limit on maximum input power to a FET, and furthr since the input voltage signal to each individual FET is reduced, the total device periphery of each device may be increased accordingly, to maintain the same gain for each field effect transistor and to provide a concomitant increase in the output power from each one of the transistors.

One problem, however, encountered with distributed amplifiers particular those having maximum drain periphery as is possible by providing the capacitively coupled gates shown in the above-mentioned patent is that the output power is limited particularly at the high end of the frequency band. Accordingly, a technique which improves the output power performance of distributed amplifiers would be desireable.

SUMMARY OF THE INVENTION

I now believe that the the output power is limited due to a very low impedance presented to the drains of the field effect transistors particularly at the high end of the frequency band. This low impedance is caused by two factors. The first factor is related to the intrinsic drain source capacitance of each one of the field effect transistors. As the drain periphery is increased as is possible by providing the capacitively coupled gates, the output capacitance increases which causes the drain line to become loaded down particularly at the higher end of the frequency band. The second cause of low output impedance is due to the phasing of output signals from each of the FETS. Since the impedance seen by each FET is dependent not only on the terminations at either end of the drain line but also on the output characteristic of all the other FETS, it is possible for a drain to present a low and possible negative impedance at certain frequencies and thus absorb power. Further, output impedance of the amplifier and of each FET is also related to the characteristic impedances of the gate transmission line and the drain transmission line both. Since neither of these lines are ideal nor identical differences in phasing of the output signals may result.

In accordance with the present invention, a radio frequency circuit includes a plurality of successively coupled field effect transistors, each having an input electrode and a output electrode. Each input electrode is coupled by a common input coupling means which feeds successive input signal portions to each one of the transistors. Each output electrode is coupled by a common output means for successively coupling the output electrode of each one of the transistors to a output terminal of the circuit. The common output coupling means includes means coupled to the output electrodes of selected ones of the successive transistors for decreasing the effective output capacitance of the selected transistors. With this arrangement, the means for decreasing the effective output capacitance of the selected coupled transistors will provide a concomitant increase in the effective output impedance of the selected, coupled transistors. This will provide a concomitant reduction in capacitive output loading on the output line, and a corresponding increase in output power from the circuit.

In accordance with a further aspect of the present invention, the means for increasing the effective output capacitance includes a capacitor, connected in series between the drain of each selected transistor and the common drain line. The selected transistors having the capacitively coupled drain are the transistors disposed nearest the output terminal of the circuit. With this arrangement, the series capacitor coupled to the transistors nearest the output terminal of the circuit increase the output impedance of those transistors. Loading of the output transmission line is related to the relative low output impedance of the transistors located nearest to the output terminal, particularly at the higher end of the frequency band. The series connected capacitors increase the impedance at the drain of these selected transistors providing a concomitant increase in output power for the circuit.

In accordance with a further aspect of the present invention, the circuit includes bias means to feed a D.C. bias signal to the output electrode of each one of said transistors. In a first embodiment thereof, the bias means includes separate bias circuits coupled to each output capacitor including either a quarter-wavelength short circuit stub or a low pass filter. In a second embodiment, the bias network includes relatively high inductance inductors disposed to bypass the field effect transistors one to another so that the field effect transistors can be biased through the drain line. In a further embodiment, the bias network includes relatively high inductance inductors disposed to bypass each one of the drain coupling capacitors. With these arrangements, D.C. bias signals are fed to each one of the field effect transistors, despite the presence of the capacitors between the output electrodes of the transistors and the common output transmission line.

BRIEF DESCRIPTION OF THE DRAWINGS

The foregoing features of this invention, as well as the invention itself, may be fully understood from the following detailed description of the drawings, in which.

DESCRIPTION OF THE PREFERRED EMBODIMENTS

Figure 1:
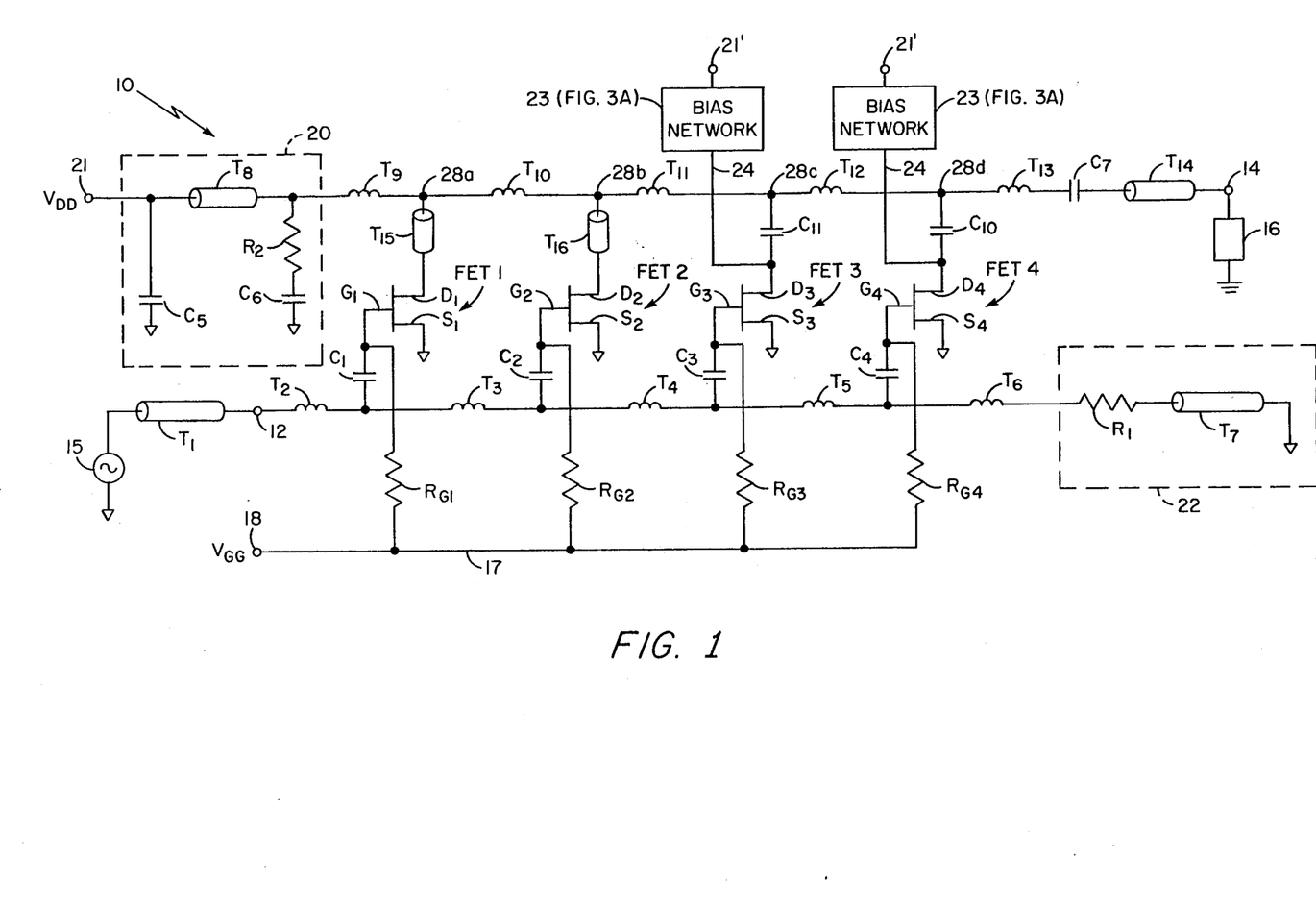
FIG. 1 is a schematic diagram of a distributed amplifier having a plurality of transistors successively interconnected between an input terminal and an output terminal in accordance with the present invention.

Referring now to FIG. 1, a distributed circuit, here a distributed power amplifier 10, is shown to include a plurality of field effect transistors here FET 1-FET 4 which are successively interconnected between an input terminal 12 and an output terminal 14 and which provide amplification of radio frequency signals fed to the input terminal 12 from a signal source 15, via transmission line $T_1$, here a microstrip transmission line having predetermined characteristic impedance $Z_0$, with such amplifier radio frequency signals appearing at the output terminal 14 and being fed to a load 16.

Figure 2:
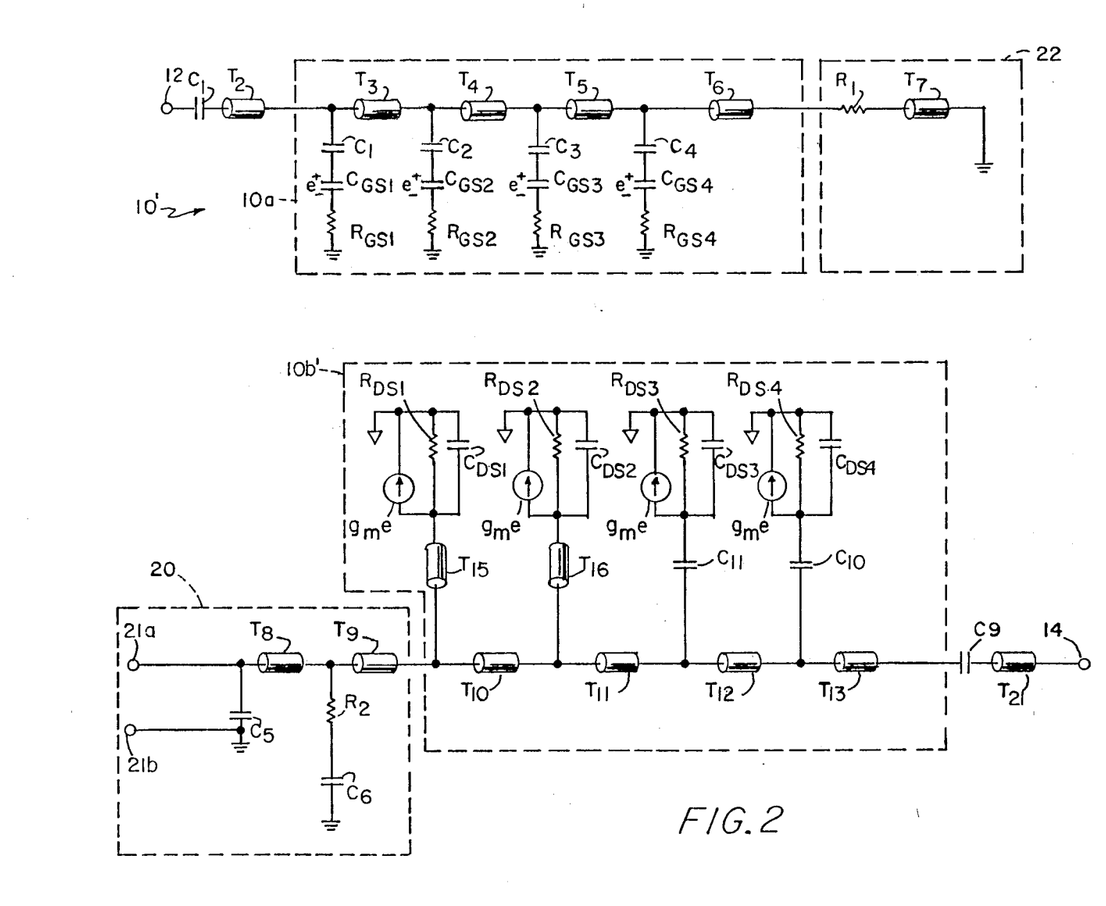
FIG. 2 is a schematic diagram of an equivalent circuit somewhat simplified of the distributed amplifier of FIG. 1.

The field effect transistors FET 1-FET 4 are here metal electrodes semiconductor field effect transistors (MESFET). The field effect transistors FET 1-FET 4 have input electrodes here gate electrodes $G_1-G_4$ respectively, electrically interconnected successively, by an input coupling means which includes transmission lines $T_2-T_7$ here microstrip transmission lines and capacitors $C_1-C_4$ respectively, as shown. Here capacitors $C_1-C_4$ have values of capacitance selected to provide a predetermined excitation to each one of the field effect transistors FET 1-FET 4. Therefore, tailored amounts of input power are delivered to each one of the field effect transistors, in accordance with the inherent capacitance $CGS_1-CGS_4$ (FIG. 2) of each transistor, as generally described in U.S. Pat. No. 4,543,535.

The output electrodes, here drain electrodes $D_1-D_4$ of such field effect transistors FET 1-FET 4 respectively, are here successively interconnected to the output terminal 14 via an output coupling means including common transmission lines $T_9-T_{13}$ drain connected transmission lines $T_{15}$, $T_{16}$ and drain coupling capacitors $C_{10}$ and $C_{11}$, as shown. Here each one of said transmission lines are also microstrip type transmission lines. Source electrodes $S_1-S_4$ of transistors FET 1-FET 4 respectively are coupled to a reference potential here ground through a common r.f. and D.C. electrical path, as shown.

The gate electrode $G_1$ of transistor FET 1 is coupled to transmission line $T_2$ through capacitor $C_1$ which in turn is coupled to the input terminal 12. The output electrode that is drain electrode $D_1$ of the first field effect transistor FET 1 is coupled to a drain D.C. bias circuit 20, via transmission line $T_9$, as shown. A succeeding one of the field effect transistors here the last or fourth field effect transistor FET 4 has the input or gate electrode $G_4$ thereof coupled to a gate transmission line termination circuit 22 through capacitor 24, as shown, with the output or drain electrode $D_4$ of transistor FET 4 connected to the output terminal 14 via capacitor $C_{10}$ and transmission lines $T_{13}$ and $T_{14}$, as shown. Serially connected transmission line section $T_{14}$ and D.C. blocking capacitor $C_7$ coupled the output transmission line means to the output terminal 14, as shown.

It is to be noted that the electrical pathlengths between the input terminal 12 and the output terminal 14 through each one of the field effect transistors FET 1-FET 4 are substantially equal over the frequency band of operation of the device. That is the capacitance of coupling capacitors $C_1-C_4$, the electrical pathlengths of transmission line sections $T_3-T_5$ and $T_{10}-T_{16}$ and the capacitance of capacitors $C_{10}$ and $C_{11}$ and the phase or delay characteristics of FET 1-FET 4 are selected in combination to provide such substantially equal electrical pathlengths.

Here gate bias is provided to each one of the field effect transistors FET 1-FET 4, via a corresponding plurality of high impedance resistors $R_{G1}-R_{G3}$ connected to a common D.C. line 18, as shown.

The drain bias circuit 20 is here a ladder network as generally known, and described in U.S. Pat. No. 4,543,535 and includes two shunt paths to ground via capacitor $C_5$ and capacitor $C_6$ and resistor $R_2$ with microstrip transmission lines $T_8$ and $T_9$ providing the series of elements of such network. Input terminal 21 is provided to couple a D.C. bias source to such network, as shown.

As further shown in FIG. 1, separate bias networks 23 (FIG. 3A) or alternatively 23' (FIG. 3B) are used to couple a D.C. bias to drain electrodes $D_3$ and $D_4$, as also shown. Accordingly, a direct D.C. current path is provided to drains $D_1$ and $D_2$ via the drain bias circuit 20 and separate D.C. bias paths are provided to drain electrodes $D_3$ and $D_4$ via separate bias networks 23.

In operation, a r.f. input signal from r.f. source 15 is fed to input terminal 12 via transmission line $T_1$ and is coupled through capacitors $C_1$-$C_4$ to each one of the corresponding gate electrodes $G_1$-$G_4$ of field effect transistors FET 1-FET 4. Here transistors FET 1-FET 4 are biased to provided gain to such signals. The amplified signal from FET 1 is coupled from drain electrode $D_1$ to transmission line $T_{15}$ and is fed to a junction 28a and propagates along transmission lines $T_9$-$T_{13}$ to junction 28d. The amplified signal from FET 2 is coupled to transmission line $T_{16}$ and to a junction 28b and propagates along transmission lines $T_{11}$-$T_{12}$, and is combined to in phase at junction 28d with the previous signal coupled from FET 1. The amplified signal from FET 3 is coupled from drain electrode $D_3$ to drain coupling capacitor $C_{11}$ and is fed to a junction 28c, and propagates along transmission line $T_{12}$ to junction 28d. Similarly, the amplified signal from transistor FET 4 is fed through capacitor $C_{10}$ to junction 28d. Each of said signals, therefore, are combined in phase at junction 28d and provide a composite signal which is coupled to the output terminal 14.

The presence of drain coupling capacitors $C_{10}$ and $C_{11}$ reduces the capacitive drain loading on the output transmission line comprising transmission line sections $T_9$-$T_{13}$. This capacitor when provided in combination with the intrinsic output capacitance $C_{ds3}$ and $C_{ds4}$ (FIG. 2) of the respective transistors FET 3 and FET 4 decreases the effective output capacitance of the transistors and accordingly increases the output impedance of each one of output coupled transistors. The increase in output impedance is particularly important at high frequencies in the operating band of the circuit. Other techniques which can increase the output capacitors of the transistors may alternatively be used.

Generally, the value of capacitance of capacitors $C_{10}$ and $C_{11}$ is selected in accordance with the drain to source capacitance of the particular transistor. That is, the capacitors are typcially chosen to be within an order of magnitude of the intrinsic drain to source capacitance. If the capacitance is too low compared to the intrinsic drain to source capacitance, too much gain from the amplifier will be lost. However, if the capacitance is chosen too high, then the effect on the output capacitance will be negligible. Typically, therefore, the capacitance is in the range of an order of magnitude of the intrinsic drain to source capacitance, and is preferable less than 3 times the value of Cds.

Figure 3A:
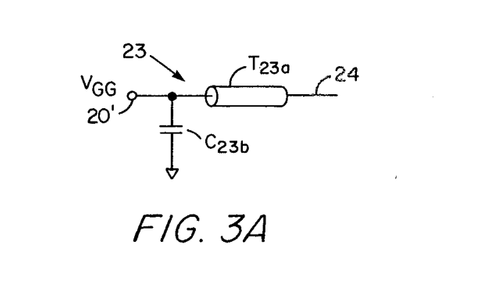
FIGS. 3A and 3B are schematic diagrams of dedicated bias networks for the circuit shown in FIG. 1.
Figure 3B:
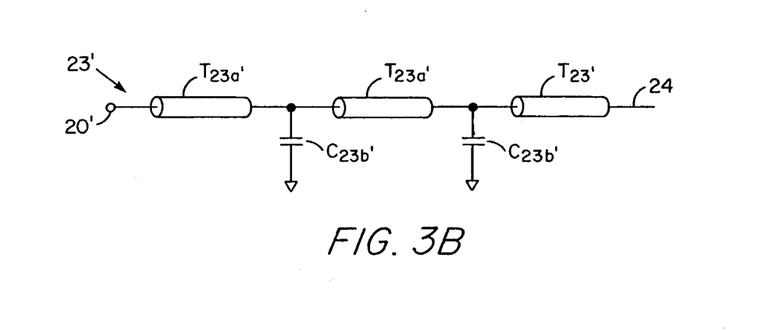

Referring now to FIGS. 3A and 3B, two embodiments of dedicated bias networks 23, 23' for capacitively coupled drain electrodes are shown. Referring first to FIG. 3A, here the bias network 23 includes a capacitor coupled in shunt between ground and the bias terminal $V_{DD}$. The series element of such network includes a transmission line section $T_{23a}$ having an electrical path length substantially equal to a quarter of a wavelength at the midband point of the passband of the circuit. One end of said quarter-wavelengths transmission line is connected to terminal $V_{GG}$ and the other end of said transmission line provides path 24 which is connected to the drain electrode side of capacitors $C_{10}$ and $C_{11}$, as shown. This bias circuit is useful for circuits having a moderate bandwidth since the series line 23a must act as a relatively high impedance path to r.f. signals. At frequencies having corresponding quarter-wavelengths equal to the electrical path length of transmission line section $T_{23a}$, the r.f. impedance of said line will be substantially equal to an open circuit. However, as frequencies deviate from this frequency, the r.f. impedance of transmission line $T_{23a}$ will decrease correspondingly.

In order to provide circuits having larger bandwidths, the arrangement shown in FIG. 3B my be used. Bias circuit 23' is a low pass filter network having two shunt paths to ground provided by capacitors $C_{23b'}$ and a series path provided ' by transmission line sections $t_{23a'}$.

Figure 4:
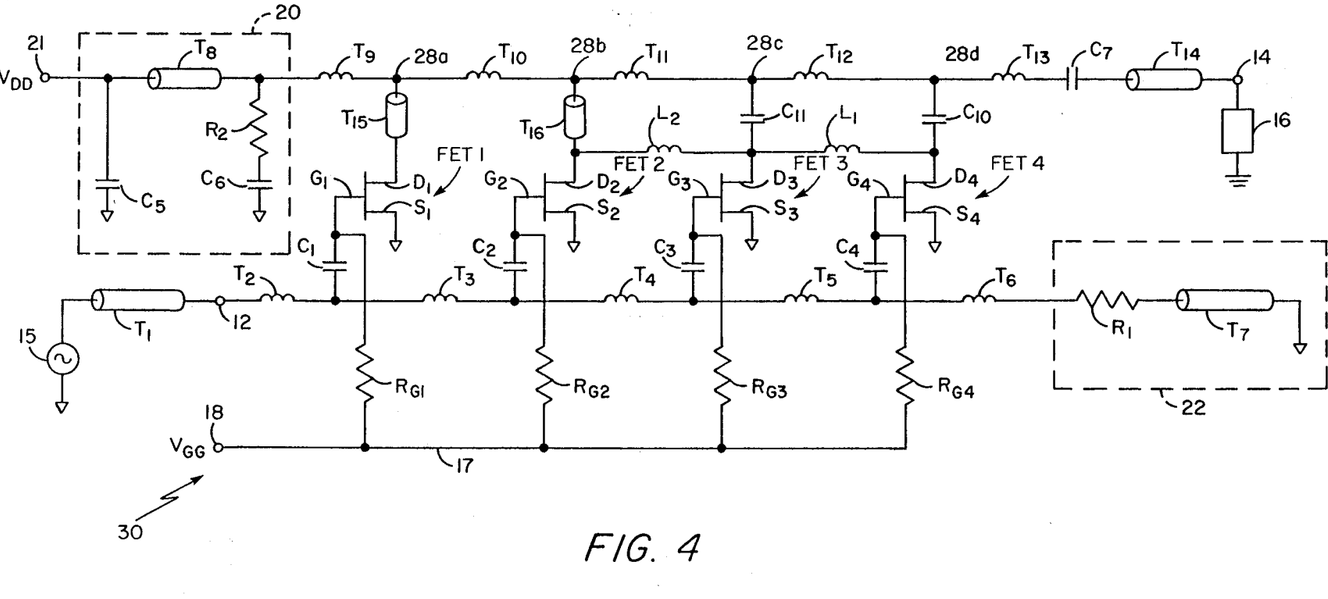
FIG. 4 is a schematic diagram of an alternate embodiment of the distributed amplifier generally as described in conjunction with FIG. 1 having an alternate biasing arrangement.
Figure 5:
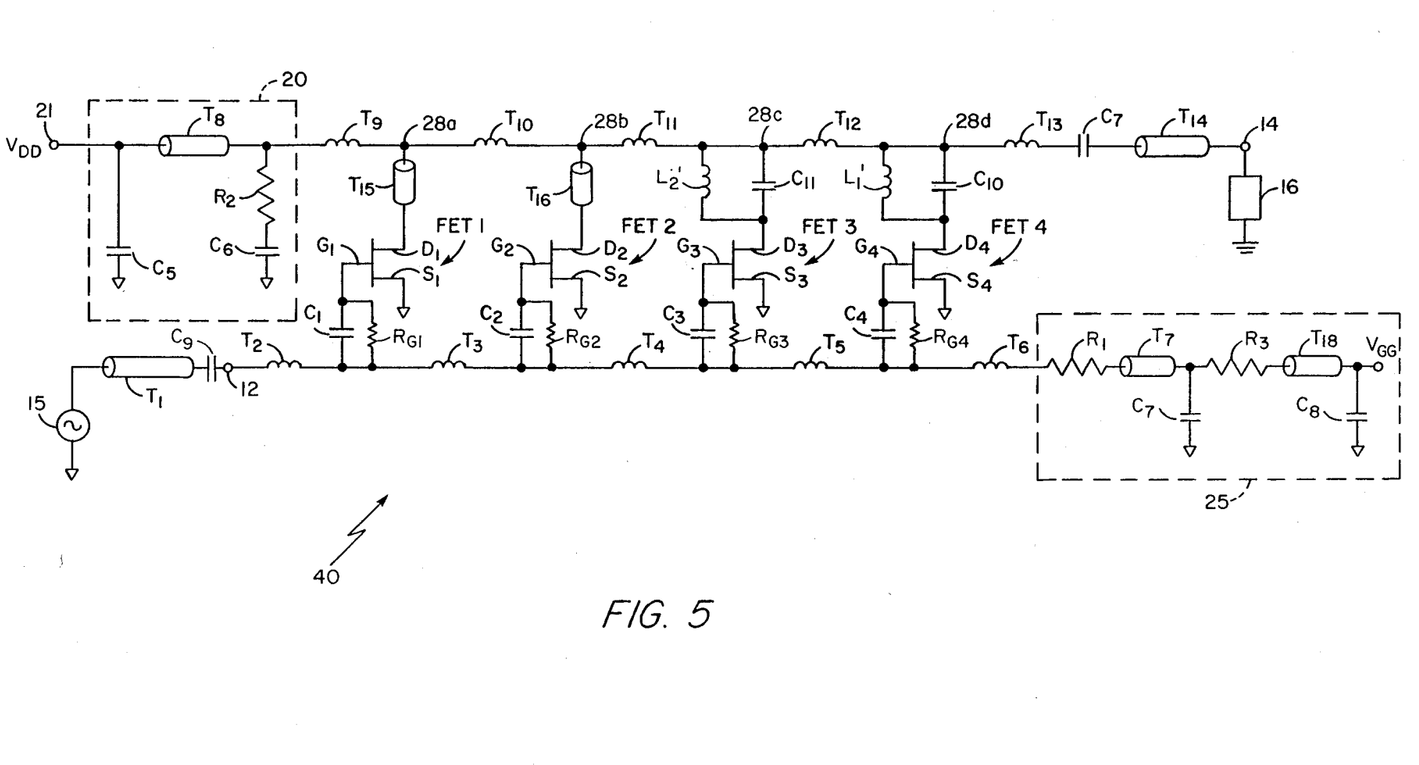
FIG. 5 is a schematic diagram of the amplifier generally as described in conjunction with FIG. 1 having a further embodiment of a biasing network.

Referring now to FIGS. 4 and 5, alternate techniques for biasing the transistors having the capacitively coupled drains are shown. Referring first to FIG. 4, a distributed amplifier 30 has inductors $L_1$, $L_2$ having a high inductance value connected to bypass transmission line sections $T_{11}$, $T_{12}$ and capacitors $C_{10}$ and $C_{11}$ as shown and, therefore, provide a D.C. bias path to transistors FET 3 and FET 4 via transmission lines $T_9$, $T_{10}$, $T_{16}$ and inductors $L_2$ and $L_1$. With this arrangement, any resonances in the large value inductors are damped by the inductance of the drain transmission line sections $T_{16}$, $T_{11}$, and $T_{12}$. Accordingly, this arrangement will minimize any degradation in performance due to a resonance between the inductor elements $L_1$, $L_2$ and capacitors $C_{10}$ and $C_{11}$.

As shown in FIG. 5, an alternate arrangement to bias transistors FET 3 and FET 4 of a distributed amplifier 40 includes inductor elements $L_1'$ and $L_2'$ shunting capacitor elements $C_{10}$ and $C_{11}$. Here since the inductor elements are coupled in shunt across the capacitors, inductor resonance with the capacitors must be avoided by using inductors having relatively low inductance values to place any resonance at frequencies above the passband of the circuit.

Figure 6:
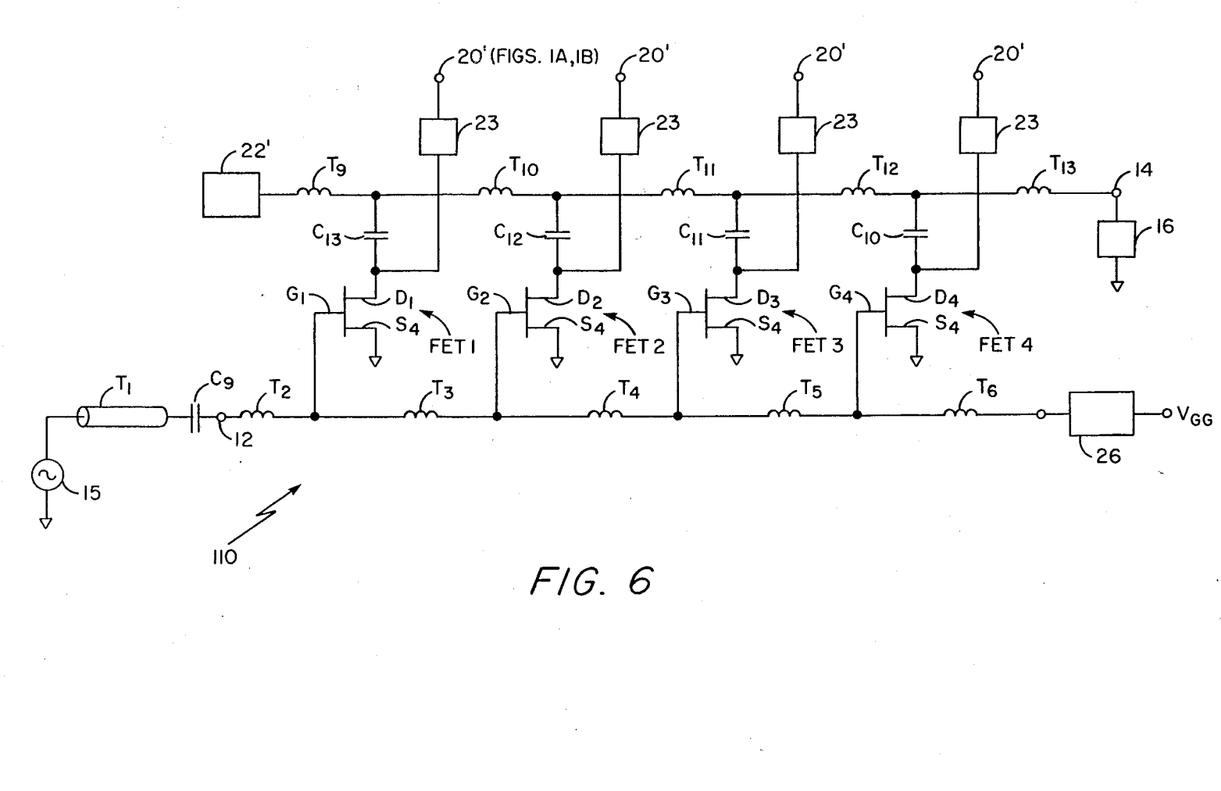
FIG. 6 is a schematic diagram of a distributed amplifier in accordance with a further embodiment of the present invention.

Referring now to FIG. 6, a further embodiment of the present invention is shown. Here the distributed amplifier circuit 110 is similar in construction to the distributed amplifier circuits described in conjunction with FIGS. 1-5, except however that the gate electrodes $G_1$-$G_4$ are directly coupled to transmission lines $T_2$-$T_6$ and the drain electrodes $D_1$-$D_4$ are each coupled to the common drain transmission line means $T_9$-$T_{13}$ via respective drain coupling capacitors $C_{10}$-$C_{13}$, as shown. With this arrangement, the capacitance of each capacitors $C_{10}$-$C_{13}$ may be selected in accordance with the other impedance elements of the circuit, to provide optimum VSWR, impedance matching, and noise performance for the distributed amplifier circuit.

Figure 7:
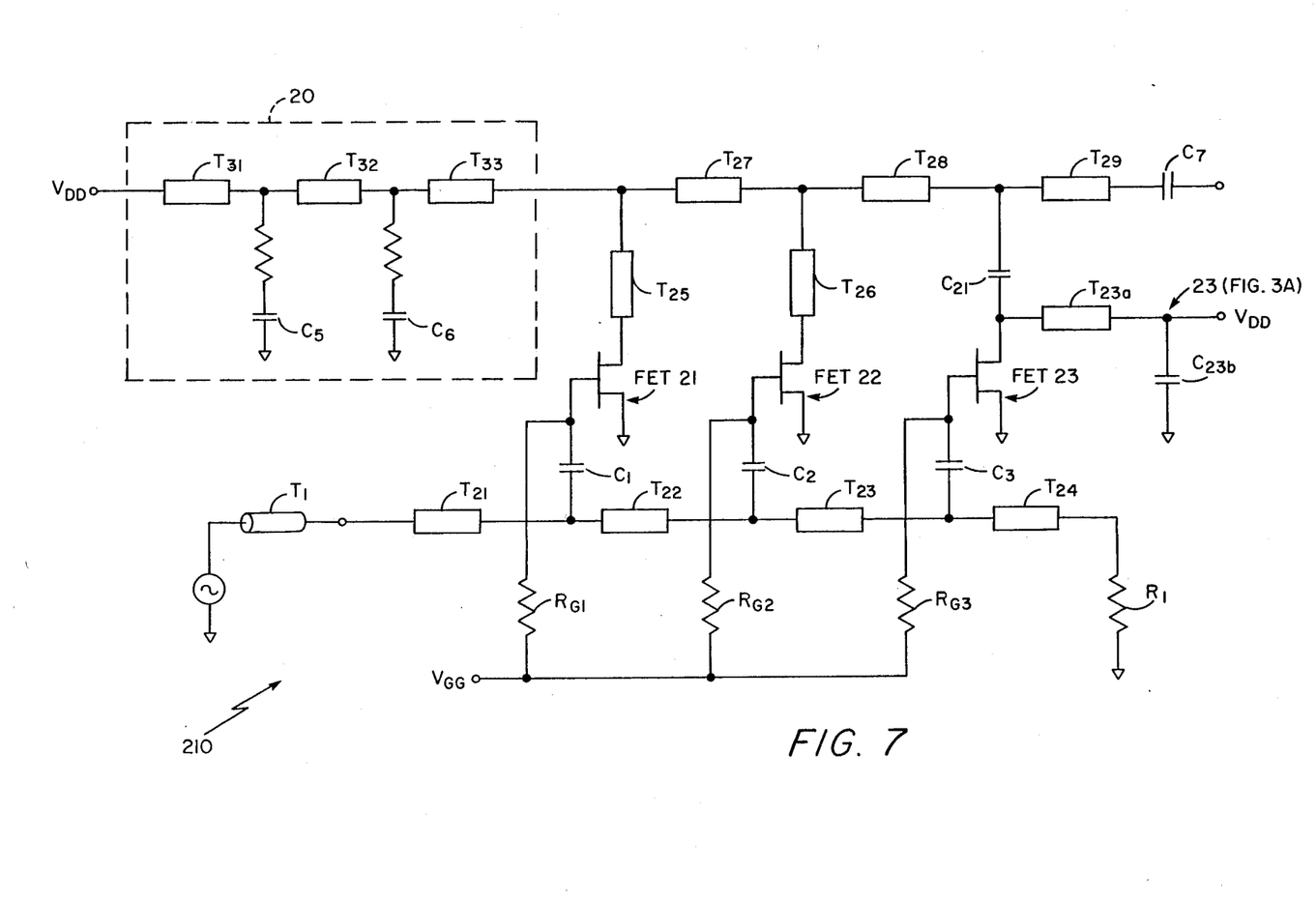
FIG. 7 is a schematic diagram of a distributed amplifier having transistors of varying periphery having a transistor with an output electrode capacitively coupled to a common output coupling means in accordance with the present invention.

Referring now to FIG. 7, a variable periphery distributed amplifier here including three metal electrode semiconductor field effect transistors is shown. The amplifier 210 includes transistors FET 21-FET 23, and is similar to that described in conjunction with FIG. 1 except, however, that each one of the transistors FET 21-FET 23 has a different and successively increasing output periphery, as indicated in the Table. The gates are connected successively by transmission lines $T_{21}$-$T_{24}$ and capacitors $C_1$-$C_3$ and the drains are successively connected by transmission lines $T_{25}$-$T_{29}$ and capacitor $C_{21}$. Drain bias is fed via network 20 and network 23 (FIG. 3A). Since the field effect transistor nearest the output terminal must deliver the most output current, it is selected to be the largest transistor. However, by increasing the size of the transistor, the output impedance presented from the drain electrode of the transistor is reduced. In a simulation of the circuit shown in FIG. 7, the real part of the impedance seen at the drain electrode of the last transistor (i.e. without the capacitor) was approximately equal to 7 ohms at 35 Ghz. Accordingly, to increase the impedance of the last transistor at 35 Ghz, the series capacitor $C_{21}$ was inserted between the drain electrode of the transistor FET 23 and the common drain transmission line.

A circuit such as shown in FIG. 7 was designed to be constructed as a microwave monolithic integrated circuit using a 4 mil thick gallium arsenide substrate and gallium arsenide metal electrode semiconductor field effect transistors formed over the substrate. Microstrip transmission lines were designed to provide the transmission line sections $T_2$–$T_5$ and $T_{21}$–$T_{30}$ and silicon nitride, dielectric capacitors were designed to provide all capacitors. Values for selected components are given in the Table. The transistors have the general construction and the capacitively coupled gate electrodes and gate bias circuits, as shown in U.S. Pat. No. 4,543,535.

TABLE

| | |
|---|---|
| FET 21 | 300 μm |
| FET 22 | 332 μm |
| FET 23 | 400 μm |
| $C_{ds23}$ | 0.11 pf |
| $C_1$ | 0.13 pf |
| $C_2$ | 0.55 pf |
| $C_3$ | 2.5 pf |
| $C_{21}$ | 0.25 pf |

As shown in the Table, the value of $C_{21}$ is within an order of magnitude of $C_{ds23}$. The exact value of capacitor $C_{21}$ is dependant upon the particular requirements of the circuit, since capacitor $C_{21}$ will have an effect on over all output impedance of the amplifier, VSWR and signal to noise ratio as well as output power.

Figure 8A:
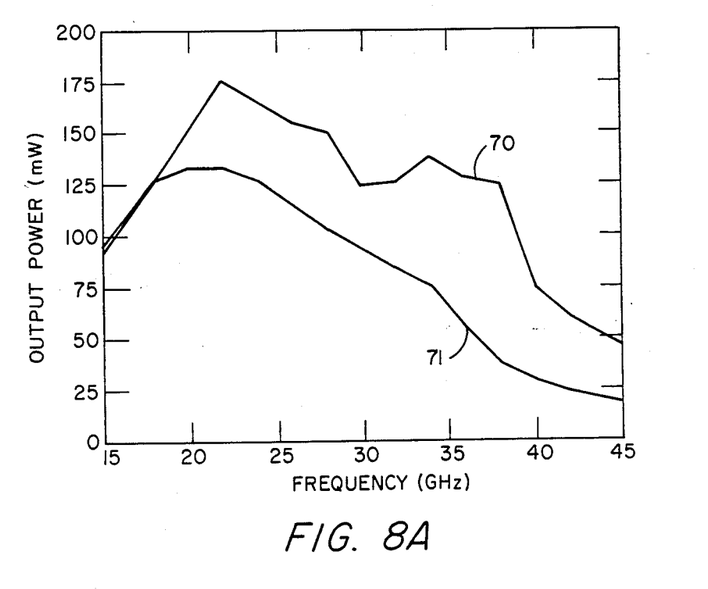
FIG. 8A is a plot of predicted output power (mW) vs. frequency (GHz) for a conventional amplifier and for an amplifier in accordance with the invention as described in conjunction with FIG. 7.
Figure 8B:
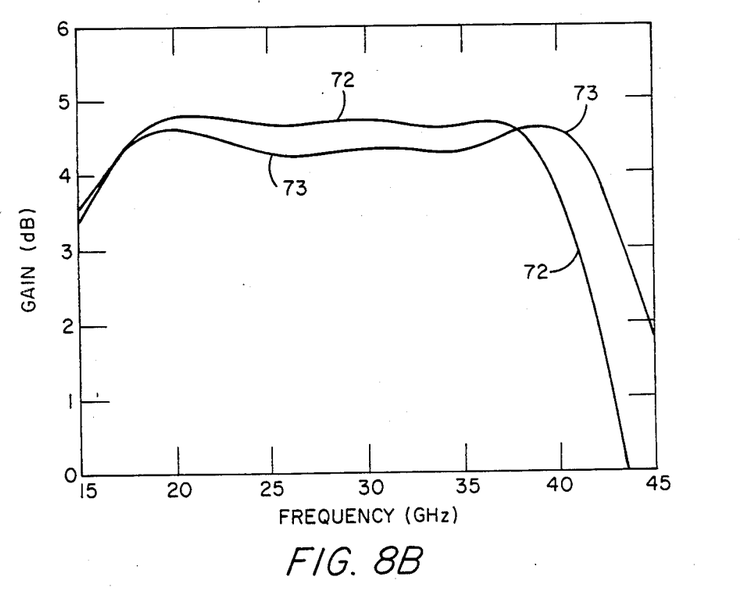
FIG. 8B is a plot of predicted gain (db) vs. frequency for a conventional amplifier and for an amplifier in accordance with the present invention as generally described in conjunction with FIG. 7.

Referring to FIGS. 8A and 8B at the predicted output power 1 db compression and gain as functions of frequency for the circuit shown in FIG. 7 (curves 70 and 73 respectively) and for a circuit similar to that of FIG. 7 without the drain capacitor in the last transistor (curves 71, 72 respectively), are shown. This comparison shows the predicted output power (FIG. 8A) between 20 GHz and 45 GHz to be about 25 mW to 50 mW more for the amplifier with the drain capacitor $C_{21}$. On the otherhand, the predicted gain (FIG. 8B) is lower by about 0.3 db or less over 20 GHz to 37 GHz. However, the amplifier with the drain capacitor $C_{21}$ has at least 3.5 db of gain between 15 GHz and about 43.6 GHz, whereas the amplifier without the capacitor has at least 3.5 db of gain only between about 15 GHz and 40.5 GHz. Accordingly, the bandwidth as measured by gain, the amplifier is also larger with the amplifier having the capacitively coupled drain electrode.

Having described preferred embodiments in the invention, it will now become apparent to one of the skill in the art that other embodiments incorporating their concepts may be used. It is felt, therefore, that these embodiments should not be limited to disclosed embodiments, but rather should be limited only to by the spirit and scope of the appended claims.

What is claimed is:

1. In combination:
   a plurality of successively coupled field effect transistors, each one thereof having an input electrode and an output electrode, with said transistors further having a predetermined reactive component between the output electrode and a reference potential;
   input means for feeding input signals to the input electrode of each one of said transistors; and
   output means for successively coupling the output electrode of each one of the transistors to an output terminal, said means further including:
   means, coupled between the output electrode of at least a selected one of the transistors and said means for successively coupling, for reducing the effective output capacitance of the selected transistor.

2. The combination as recited in claim 1 wherein the output means further includes a common transmission line, and a plurality of transmission lines coupled between the output electrodes of the unselected transistors and the common transmission line, and said means for reducing effective output capacitance includes a capacitor connected between the common transmission line and the output electrode of the selected transistor.

3. The combination of claim 2 wherein the value of capacitance of the capacitor coupled between the output electrode of the coupled transistor and the common transmission line is selected in accordance with an inherent output capacitance of the coupled transistor to provide the coupled transistor with a selected impedance.

4. The combination as recited in claim 1 wherein the output means includes a plurality of capacitors, each one of said capacitors being coupled between the output electrode of a corresponding one of said plurality of transistors and the output coupling means.

5. The combination of claim 4 wherein the value of capacitance of each one of the plurality capacitors is selected in accordance with an inherent output capacitance of each of the transistors to provide each of the transistors with a selected output impedance.

6. The combination of claim 5 wherein the output coupling means further includes a common distributed transmission line coupled between the output terminal and a bias terminal and wherein the capacitors are coupled between the output electrodes of the plurality of transistors and said common distributed transmission line.

7. The combination as recited in claim 2 further comprising means for providing a D.C. bias signal to the output electrode of each transistor having a capacitor coupled to the output electrode and common transmission line.

8. The combination as recited in claim 7 wherein the bias circuit includes low pass filters connected to the capacitor coupled output electrode.

9. The combination as recited in claim 7 wherein the bias circuit includes at least one inductor connected between the output electrode of a capacitor coupled transistor and the output electrode of a preceding transistor.

10. A distributed amplifier having an input terminal and an output terminal comprising:
   a plurality of successively coupled field effect transistors, each one thereof having an input electrode, a reference electrode and an output electrode;
   a radio frequency coupling means for successively coupling the input electrode of each one of said transistors to the input terminal, said means including a radio frequency transmission line and a plurality of capacitors with each one of said capacitors being connected between one of the input electrodes and said radio frequency transmission line;

output means for successively coupling the output electrode of each transistor to the output terminal, said output means further including, a common coupling means, and at least one capacitor connected between the common coupling means and output electrode of a selected one of said transistors.

11. The distributed amplifier of claim 10 wherein said capacitor is connected to the transistor nearest said output terminal.

12. The distributed amplifier as recited in claim 10 wherein the output means further includes a common transmission line, a plurality of transmission lines connected between the output electrodes of the field effect transistors and the common transmission line with said capacitor being connected between the common transmission line and the output electrodes of the last transistor.

13. The distributed amplifier of claim 12 wherein the value of capacitance of the capacitor coupled between the drain electrode of the transistor mearest the output terminal is selected in accordance with an inherent output capacitance of said transistor nearest the output terminal to increase an output impedance of said transistor over a frequency band of operation of said distributed amplifier.

14. The combination as recited in claim 13 further comprising means for providing a D.C. bias signal to the drain electrodes of the transistor nearest the output terminal.

15. The combination as recited in claim 14 wherein the bias circuit means includes low pass filter.

16. The combination as recited in claim 14 wherein the bias circuit is an inductor connected between the drain electrode of the transistor nearest the output terminal, and the drain electrode of a preceding transistor.

* * * * *